United States Patent [19]

Lee

[11] Patent Number: 5,001,369

[45] Date of Patent: Mar. 19, 1991

[54] LOW NOISE OUTPUT BUFFER CIRCUIT

[75] Inventor: Terry R. Lee, Boise, Id.

[73] Assignee: Micron Technology, Inc., Boise, Id.

[21] Appl. No.: 545,789

[22] Filed: Jul. 2, 1990

[51] Int. Cl.⁵ .................. H03K 19/02; H03K 5/12; H03K 3/289

[52] U.S. Cl. .................. 307/473; 307/448; 307/263; 307/592; 307/272.1; 307/272.2

[58] Field of Search .............. 307/443, 448, 451, 473, 307/263-264, 592-594, 603, 606, 272.1-272.2

[56] References Cited

U.S. PATENT DOCUMENTS

| | | | |
|---|---|---|---|
| 4,695,743 | 9/1987 | Des Brisay, Jr. | 307/272.2 |
| 4,820,942 | 4/1989 | Chan | 307/473 |
| 4,825,101 | 4/1989 | Walters, Jr. | 307/263 |
| 4,827,157 | 5/1989 | Machida et al. | 307/263 |
| 4,918,332 | 4/1990 | Nix | 307/263 |

Primary Examiner—Stanley D. Miller
Assistant Examiner—Margaret Rose Wambach
Attorney, Agent, or Firm—Stanley N. Protigal; Angus C. Fox

[57] ABSTRACT

A low-noise output buffer circuit that activates and deactivates the output by means of a two stage NAND and FET circuit, which senses a low voltage in a first stage pull-up (pull-down) NAND output before activating pull-down (pull-up) devices and the second stage, thereby minimizing the power supply current spike that normally appears during input and output switching operations.

20 Claims, 3 Drawing Sheets

LOW NOISE OUTPUT BUFFER CIRCUIT

BACKGROUND OF THE INVENTION

Field of the Invention

This invention relates to a low noise complimentary metal oxide semiconductor (CMOS) tri-state output buffer circuit that sequentially activates alternate CMOS devices by means of input sampling of a first set of CMOS devices.

Many techniques have been employed to reduce the power and ground current spikes associated with output buffers switching in CMOS circuits. Output buffers are used in order to provide sufficient current drive to switch the large parasitic capacitances associated with both package and printed circuit board interconnects. Low noise outputs are particularly important in a video random access memory (VRAM) integrated circuit (IC), since there are as many as eight outputs switching simultaneously which are asynchronous to the dynamic random access memory (DRAM) timing i.e., serial data outputs (SDQs). Failures caused by power supply noise can occur when the SDQ outputs switch at critical periods in the DRAM timing.

Summary of the Invention

The CMOS devices used in this circuit comprise eight pairs of field effect transistors (FET), a plurality of logic signal inverters, a pair of delay circuits, a plurality of NAND gates, and appropriate resistors. The FETs are arranged to comprise a two-stage driver circuit. The VRAMs described above that would most likely use this circuit would be used in graphic displays for computer work stations and personal computers. In this application, the VRAM would need seventeen of these circuits, one for a special function output, eight for serial access data outputs (SDQs) and eight more for the data outputs (DQs).

There are advantages of this invention over prior art since the output stage reduces power and ground noise caused by output switching which can be guaranteed over process variation. This improvement is important especially for a VRAM, since several outputs switch simultaneously i.e., (SDQs) which are asynchronous to the DRAM operation. Thus, failures associated with the SDQ outputs switching during critical periods of the DRAM timing should be reduced.

DETAILED DESCRIPTION OF THE INVENTION

Figure 1:
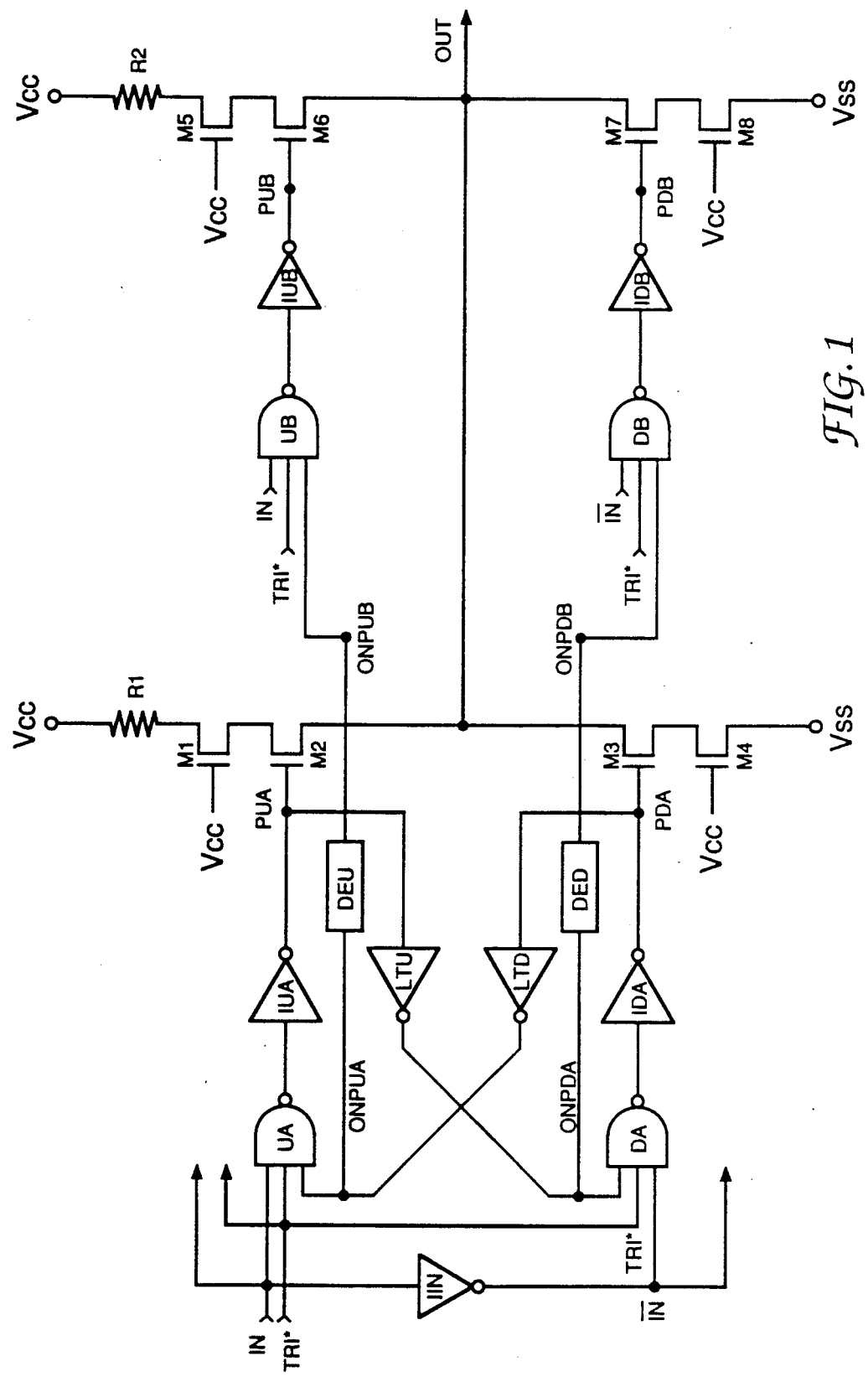
FIG. 1 is an electrical schematic of the present invention.

A description of the two-stage buffer circuit will be made by referring to FIG. 1. Pull-up logic gates UA and UB, pull-down logic gates DA and DB, pull-up inverters IUA and IUB, pull-down inverters IDA and IDB, and low-voltage trip inverters LTU and LTD are connected as shown to driver stages M1–M4 and M5–M8.

The device labels ending in "A" and M1 through M4 represent the first stage of the buffer circuit, while the devices ending in "B" and M5 through M8 represent the second stage. The logic gates associated with the control of the pull-up devices contain a "U", whereas the logic gates associated with the pull-down device control contain a "D".

A unique element of the invention is the two low-voltage trip inverters LTU and LTD which turn on the buffer second stage as their input voltages go below 1 v. This is the input sampling feature that provides consistent FET sequential turn-on regardless of process variations such as temperature changes, which tend to slow down all signal edges such as those associated with ramps or speed of signal decay. Said FET sequential turn-on prevents, for example, M2 and M3 from being simultaneously on, thus eliminating current crossing from $V_{cc}$ to $V_{ss}$ ("crossing current"). All current demanded by the driver stage goes directly to its load. Another unique element is the use of a two-stage output device in lieu of a single stage. FETs M1–M4 and M5–M8 comprise two output driver stages. Resistors R1 and R2 typically are used to limit the current from $V_{cc}$. Note, however, that adding a resistor(s) at $V_{ss}$ cannot be used to limit the ground current at $V_{ss}$ without sacrificing TTL $V_{OL}$ (maximum allowable voltage in the low state).

Transistors M1, M4, M5, and M8 reduce source-to-drain voltage VDS across M2, M3, M6, and M7, reducing substrate injected current. Long transistor lengths are additionally used.

When switching the output to low, driver pull-up device M2 must be turned off prior to turning driver pull-up device M3 on, to eliminate crossing current. If M2 and M3 were turned on simultaneously, a low impedance path would exist between $V_{cc}$ and $V_{ss}$, which would increase supply noise and could cause other internal circuits to fail. A delay element could be used to perform this function, but a better approach is to sample the input of the gate of M2 to guarantee that the device is off prior to turning transistor M3 on. This is accomplished with low trip point inverter LTU, for example one that trips ON at a decreasing input of about 1 v. The enabling signal ONPDA is not asserted until the gate signal PUA is within a threshold voltage of ground (about 1 v). Delays provided by NAND gate DA and inverter IDA further guarantee that M2 is completely off prior to turning M3 on.

This approach to eliminating $V_{ss}$ crossing current has the advantage of better stability over temperature and process variations when compared to a delay element. The same principles apply to the second driver stage M5–M8, as M6 is ultimately controlled by ONPUA and M7 is ultimately controlled by ONPDA.

Figure 2:
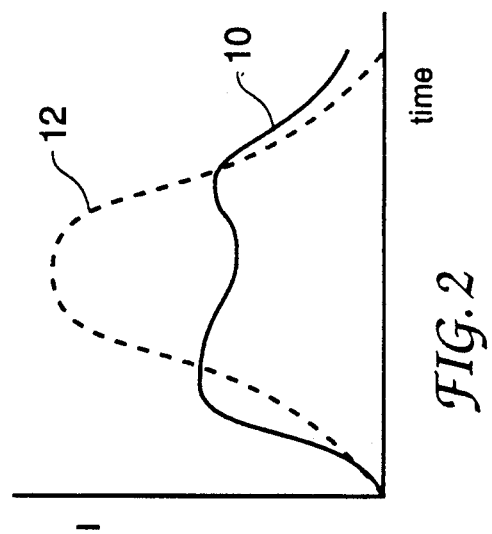
FIG. 2 is a plot of power supply current versus time during a switching cycle.

Referring to FIG. 2, it is a purpose of this invention to have the two stages of the output driver fired in sequence to reduce the maximum current spike 10 on $V_{cc}$ or ground ($V_{ss}$) as compared to the single output stage current spike at 12. The effect of a current transient is to cause an electrical transient voltage dip on the power supply at $V_{cc}$ which will disturb other internal voltages in the integrated circuit.

Figure 3:
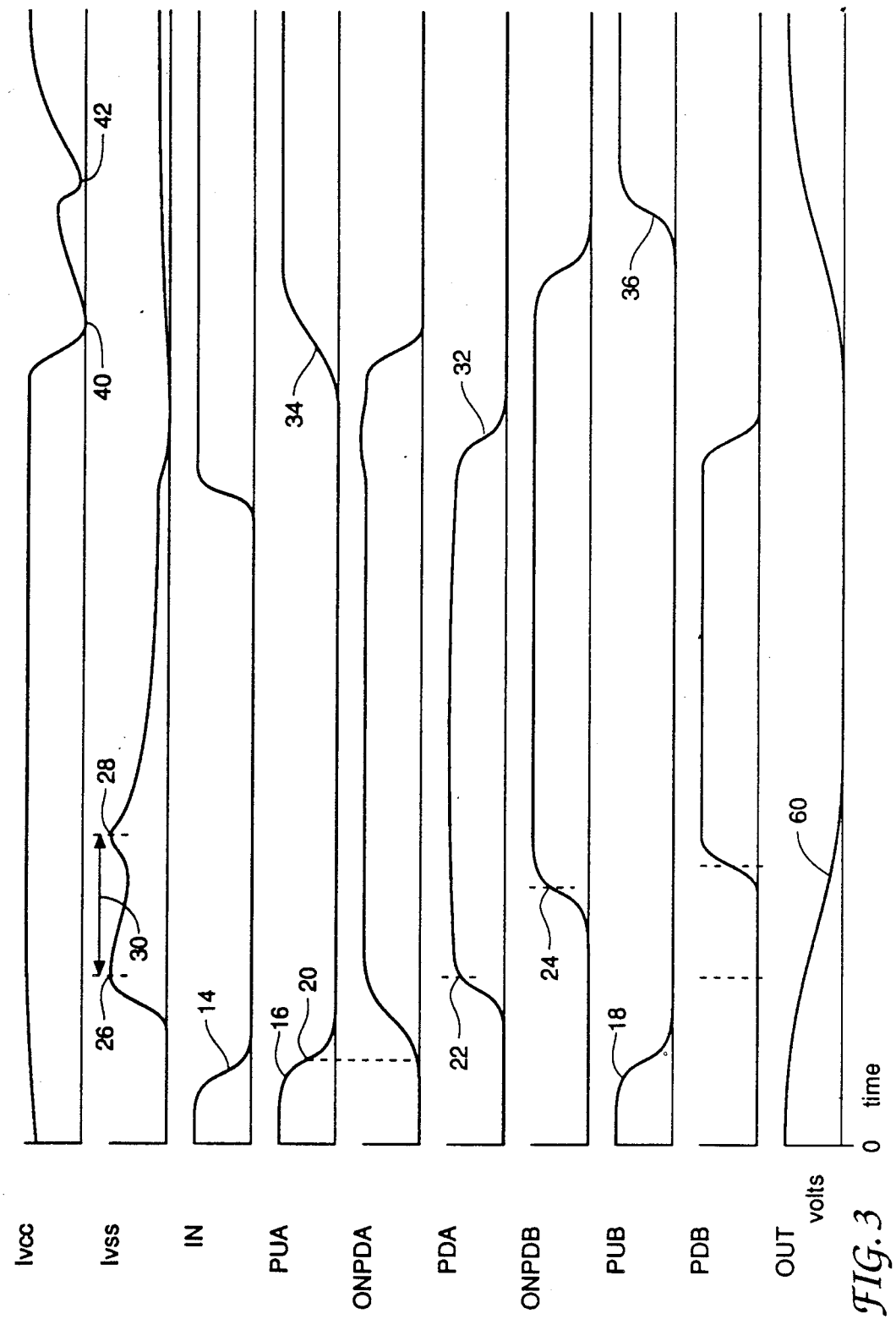
FIG. 3 is a high-speed trace of currents and voltages during switching.

Understanding the operation of the circuit will be aided by referring to FIG. 3, which is a high speed transient recording of a cycle of the present invention sampling ten parameters in the circuit. The top two traces show the current in mA. (It should be noted that due to instrumentation methods the current trace $I_{vcc}$ representing current into $V_{cc}$ terminal is inverted.) The remaining eight traces below record 0 v-5 v. 5 v is a nominal power supply voltage $V_{cc}$ for this integrated circuit.

Referring to FIG. 3, when IN signal goes to a low state as at 14, signals PUA and PUB immediately turn off due to NAND gates UA and UB and inverters IUA and IUB as illustrated at 16 and 18. ONPDA goes high when signal PUA is within 1 v of ground as at 20. PDA then goes high at 22 which turns on M3. Some time later, as set by the delay element DED, ONPDB goes high at 24 which turns on M7. Note in FIG. 3 how the $V_{ss}$ current spikes at 26 as the first stage M3 fires, decays, then spikes again at 28 as the second stage M7 fires. The output OUT trace changes slowly from a high to low state during this two-stage action. The delay value 30 shown in FIG. 3 is about 4 ns, and can be adjusted to trade off output transition times and power supply transient noise due to the current spike height. Note also that there is no significant $V_{cc}$ current $I_{vcc}$ that flows to $V_{ss}$ ($I_{vss}$). This illustrates the elimination of crossing current by sampling PUA. In a similar manner, the M2 and M6 MOS transistors are fired as initiated by inverted signal IN which causes PDA and PDB to go low. As PDA signal drops below 1 v as at 32, ONPUA signal goes high (not shown) turning on M2 when PUA signal goes high at 34, followed by second stage PUB at 36 which activates gate at M6. Again the first and second stage current peaks (inverted) can be seen at 40 and 42 on $I_{vcc}$.

Note that when signal TRI* goes low (not shown), all devices turn off immediately which results in a high impedance output, the third state of the tri-stage output.

This circuit will provide a low noise output over process and temperature variations, such as those required by a VRAM. The use of a low trip point inverter guarantees that pull-down (pull-up) devices are completely off (gate-source voltage is near $V_{ss}$) prior to the pull-up (pull-down) devices turning on, thereby minimizing $V_{cc}$ to $V_{ss}$ crossing current.

Figure 4:
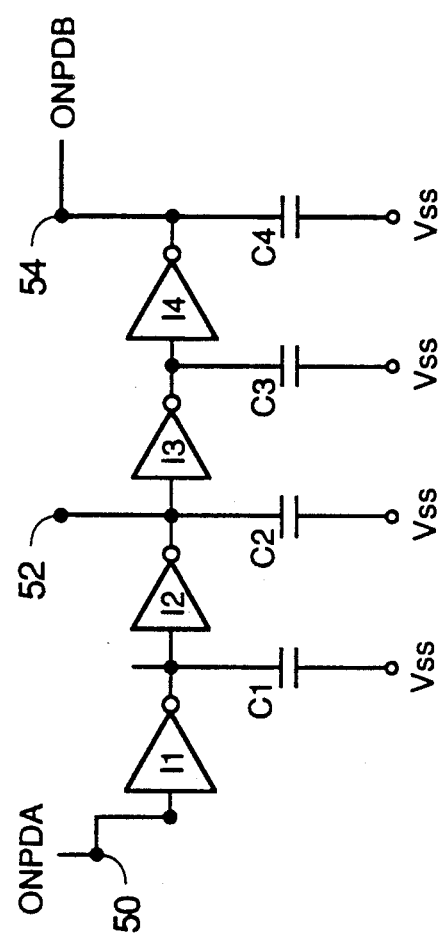
FIG. 4 is a schematic diagram of the delay circuit of the present invention.

FIG. 4 illustrates a typical delay circuit that in this case is shown connected between terminals ONPDA and ONPDB. It comprises a series of inverters I1, I2, I3, and I4 each having an output connection to capacitors C1, C2, C3, and C4 and tap connections at 50, 52, and 54 for connections to ONPDB. The time constant can be increased or decreased by selecting one of the true taps. In this delay circuit the tap 54 would provide the longer time constant or time delay. More or fewer inverters and capacitors (even numbers only) may be used to extend or reduce the time delay range. The preferred delay is about 4 ns, and a delay range of 0 ns to 4 ns is desirable. A delay of 4 ns reduces the current spike to a minimum, but extends the overall response time between IN and OUT signals as indicated by the difference in time of IN point 14 and OUT point 60 (about 12 ns). Extending the delay beyond 4 ns merely reduces second current peak to a lesser value, having no effect on the first peak, hence, no improvement in maximum peak reduction.

The selection of the tap connection may be done based on IC device testing. The tap connection alterations can be made by stopping fabrication of selected wafers prior to the last two photolithographic steps. The next to last mask and metallization step would connect the preferred tap to the second stage NAND gate input ONPDA or ONPDB. The last mask step is a protective coating and would not change between devices.

Although the present invention discloses a circuit having two stages of turn on and turn off, it is possible to add an additional stage(s) using a shorter time delay between each stage. The additional stage, although it may reduce the current spikes, would increase the IC chip fabrication complexity.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims. For example, an inverting buffer circuit is accomplished simply by removing IUA, IUB, LTU, LTD, IDA, and IDB. Cross-coupling is still provided to M2 and M3, and DEU and DED still provide a delay to the second stage. Further variation is possible, such as using NOR gate in place of NAND gates, for example.

I claim:

1. A low noise, CMOS, tri-state, output buffer circuit comprising:
   a. two pair of NAND gates having inputs and outputs, each pair consisting of a first stage and second stage so that each stage has a pull-up NAND and a pull-down NAND gate;
   b. two pair of logic inverters, each logic inverter having an input and an output, and each pair consisting of a first stage and a second stage coupled to said outputs of said NAND gates;
   c. a plurality of CMOS field effect transistors (FETs) coupled to said outputs of said logic inverters;
   d. a pair of low voltage trip inverters, each trip inverter having an input and an output, and each pair coupled to said outputs of said first stage logic inverters;
   e. power supply connections; and
   f. a pair of delay circuits coupled to said outputs of said low-voltage trip inverters wherein an input signal to said NAND gates of said first stages causes a delayed firing of said NAND gates of said second stages;
   whereby said pair of low voltage trip inverters prevents crossing current in said FETs, and whereby said delayed firing reduces current surge through said power supply connections.

2. The circuit as recited in claim 1, wherein a maximum power supply current peak occurring during switching on or switching off operation is four milliamps.

3. The circuit as recited in claim 1, wherein a parallel third state input signal to all NAND gates turns all NAND gates off immediately, resulting in high impedance output of the circuit.

4. The circuit as recited in claim 1, wherein the plurality of FETs consist of four pairs, a first FET of each pair being activated by a first stage or second stage logic inverter.

5. The circuit as recited in claim 1, wherein the delay circuits comprise:
   a. a plurality of serially coupled inverters;
   b. an electrical tap connection between each inverter; and
   c. a plurality of capacitors each having a first end coupled to each of the tap connections and a second end coupled to a power supply ground,
   wherein the time delay is selectable by coupling a second stage NAND gate input to one of the electrical tap connections.

6. The circuit as recited in claim 4, wherein a pair of pull-up FETs are connected between an output connection and serially through a resistor to a positive power supply connection.

7. The circuit as recited in claim 4, wherein a pair of pull-down FETs are coupled between an output connection and a power supply ground connection.

8. The circuit as recited in claim 5, wherein the time delay is about four nanoseconds.

9. The circuit as recited in claim 5, wherein the variable time delay range is between zero and four nanoseconds.

10. A low noise, CMOS, tri-state, output buffer circuit comprising:
    a. two pair of NAND gates having inputs and outputs, each pair consisting of a first stage and a second stage so that each stage has a pull-up NAND gate and a pull-down NAND gate;
    b. two pair of logic inverters, each logic inverter having an input and an output, and each pair consisting of a first stage and a second stage coupled to said outputs of said NAND gates;
    c. power supply connections;
    d. a pair of low voltage trip inverters, each trip inverter having an input and an output, and each pair coupled to said outputs of said first stage logic inverters;
    e. four pair of CMOS FETs, each pair coupled between said logic inverters, the power supply connections, and an output terminal; and
    f. a pair of delay circuits, each pair coupled to said outputs of said low-voltage trip inverters wherein an input signal to said NAND gates of said first stages causes a delayed firing of said NAND gates of said second stages;
    whereby said pair of low voltage trip inverters prevents crossing current in said FETs, and whereby said delayed firing reduces current surge through said power supply connections.

11. The circuit as recited in claim 10, wherein a maximum power supply current peak occurring during switching on or switching off operation is four milliamps.

12. The circuit as recited in claim 10, wherein a third state input signal to all NAND gates turns all NAND gates off immediately, resulting in high impedance output of the circuit.

13. The circuit as recited in claim 10, wherein a pair of pull-up FETs are coupled serially through a resistor to a positive power supply connection.

14. The circuit as recited in claim 10, wherein a pair of pull-down FETs are coupled between an output connection and a power supply ground connection.

15. The circuit as recited in claim 10, wherein the delay circuits comprise:
    a. a plurality of serially coupled inverters;
    b. an electrical tap connection between each inverter; and
    c. a plurality of capacitors each having a first end coupled to each of said tap connections and a second end coupled to a power supply ground,
    wherein the time delay is selectable by coupling a second stage NAND gate input to one of said electrical tap connections.

16. The circuit as recited in claim 15, wherein the time delay is about four nanoseconds.

17. The circuit as recited in claim 15, wherein the variable time delay range is between zero and four nanoseconds.

18. A method of low-noise activating and deactivating a CMOS tri-state output buffer circuit comprising:
    a. switching an IN signal from a high to low state;
    b. switching a first and a second stage pull-up NAND gate inverter to a low state;
    c. sensing a low voltage from said first stage pull-up inverter on a low-voltage trip inverter;
    d. inverting said first stage pull-up gate inverter signal from a low state to high state in said lowvoltage trip inverter;
    e. activating a pull-down delay circuit and deenergizing a first stage pull-down NAND gate;
    f. switching a first stage pull-down NAND gate inverter from a low state to high state;
    g. switching a pair of first stage pull-down FETs from a low to high state, thereby changing an output voltage from a high state to a low state;
    h. energizing a second stage pull-down NAND gate inverter from said pull-down delay circuit after a preselected time delay;
    i. switching an output from said second stage pull-down NAND inverter from a low state to high state;
    j. switching a pair of second stage pull-down FETs from a low state to high state, thereby increasing the output drive current and speed in which the output switches to a low state;
    k. changing said IN signal from the low state to a high state;
    l. an inverter to invert said IN signal; and
    m. repeating the above steps such that said pull-up first stage and second stage NANDs, inverters and FETs perform the same actions thereby slowly restoring the output voltage from a low state to a high state with a minimal switching current peak at a power supply positive terminal.

19. The method as recited in claim 18, wherein the pre-selected time delay is set at four nanoseconds.

20. The method as recited in claim 18, wherein the low voltage sensed is one volt thereby activating said low-voltage trip inverter and activating the delay circuit.

* * * * *